United States Patent
Hoke et al.

(10) Patent No.: US 7,226,850 B2
(45) Date of Patent: Jun. 5, 2007

(54) GALLIUM NITRIDE HIGH ELECTRON MOBILITY TRANSISTOR STRUCTURE

(75) Inventors: William E. Hoke, Wayland, MA (US); John J. Mosca, Carlisle, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 11/132,533

(22) Filed: May 19, 2005

(65) Prior Publication Data

US 2006/0261370 A1 Nov. 23, 2006

(51) Int. Cl.
*H01L 29/06* (2006.01)

(52) U.S. Cl. ............... 438/493; 438/483; 257/E21.127

(58) Field of Classification Search ............... 257/103, 257/E21.127; 438/483, 493
See application file for complete search history.

(56) References Cited

U.S. PATENT DOCUMENTS

| | | | |
|---|---|---|---|
| 5,060,030 A | 10/1991 | Hoke | |
| 6,271,547 B1 | 8/2001 | Hoke et al. | |
| 6,368,983 B1 | 4/2002 | Hoke et al. | |
| 6,391,748 B1 * | 5/2002 | Temkin et al. | 438/478 |
| 6,489,639 B1 | 12/2002 | Hoke et al. | |
| 6,573,129 B2 | 6/2003 | Hoke et al. | |
| 6,620,662 B2 | 9/2003 | Hoke et al. | |
| 6,797,994 B1 | 9/2004 | Hoke et al. | |
| 6,818,928 B2 | 11/2004 | Hoke et al. | |
| 6,835,969 B1 | 12/2004 | Marsh et al. | |
| 2002/0074552 A1 * | 6/2002 | Weeks et al. | 257/76 |
| 2005/0142391 A1 * | 6/2005 | Dmitriev et al. | 428/698 |
| 2006/0286782 A1 * | 12/2006 | Gaska et al. | 438/483 |

OTHER PUBLICATIONS

D.F. Storm, D.S. Katzer, S.C. Binari and B.V. Shanabrook, Effect of Al/N Ration During Nucleation Layer Growth on Hall Mobility and Buffer Leakage of Molecular-Beam Epitaxy Grown AlGaN/GaN Heterostructures, Oct. 25, 2004, pp. 3786-3788, vol. 85, No. 17, Washington, D.C.

* cited by examiner

*Primary Examiner*—Thomas L. Dickey
(74) *Attorney, Agent, or Firm*—Daly, Crowley, Mofford & Durkee, LLP (57) ABSTRACT

A semiconductor structure, comprising: a substrate; a first aluminum nitride (AlN) layer having an aluminum/reactive nitride (Al/N) flux ratio less than 1 disposed on the substrate; and a second AlN layer having an Al/reactive N flux ratio greater than 1 disposed on the first AlN layer. The substrate is a compound of silicon wherein the first AlN layer is substantially free of silicon.

3 Claims, 9 Drawing Sheets

*FIG. 1*

PRIOR ART

GALLIUM NITRIDE HIGH ELECTRON MOBILITY TRANSISTOR STRUCTURE

TECHNICAL FIELD

This invention relates generally to gallium nitride (GaN) high electron mobility transistor (HEMT) structures.

BACKGROUND AND SUMMARY

Figure 1:
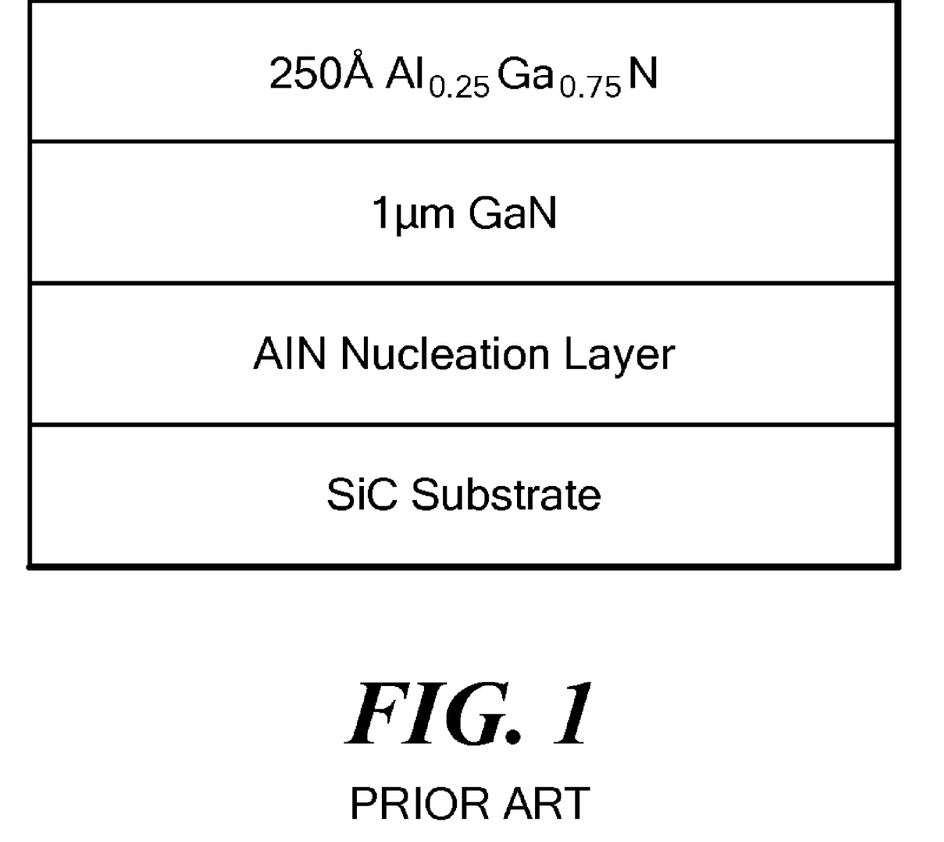
FIG. 1 is a GaN HEMT structure according to the PRIOR ART.

As is known in the art, GaN HEMT devices require insulating buffer layers for optimal performance. Unmodulated current flowing deep in the buffer layer will degrade output power and efficiency. FIG. 1 illustrates a typical GaN HEMT structure grown on an insulating SiC substrate. An aluminum nitride (AlN) nucleation layer is first grown on the substrate since gallium nitride, grown directly on SiC will exhibit a significant conductivity spike at the GaN/SiC interface. AlN has a very large bandgap (6.3 eV) which facilitates high resistivity.

Figure 2:
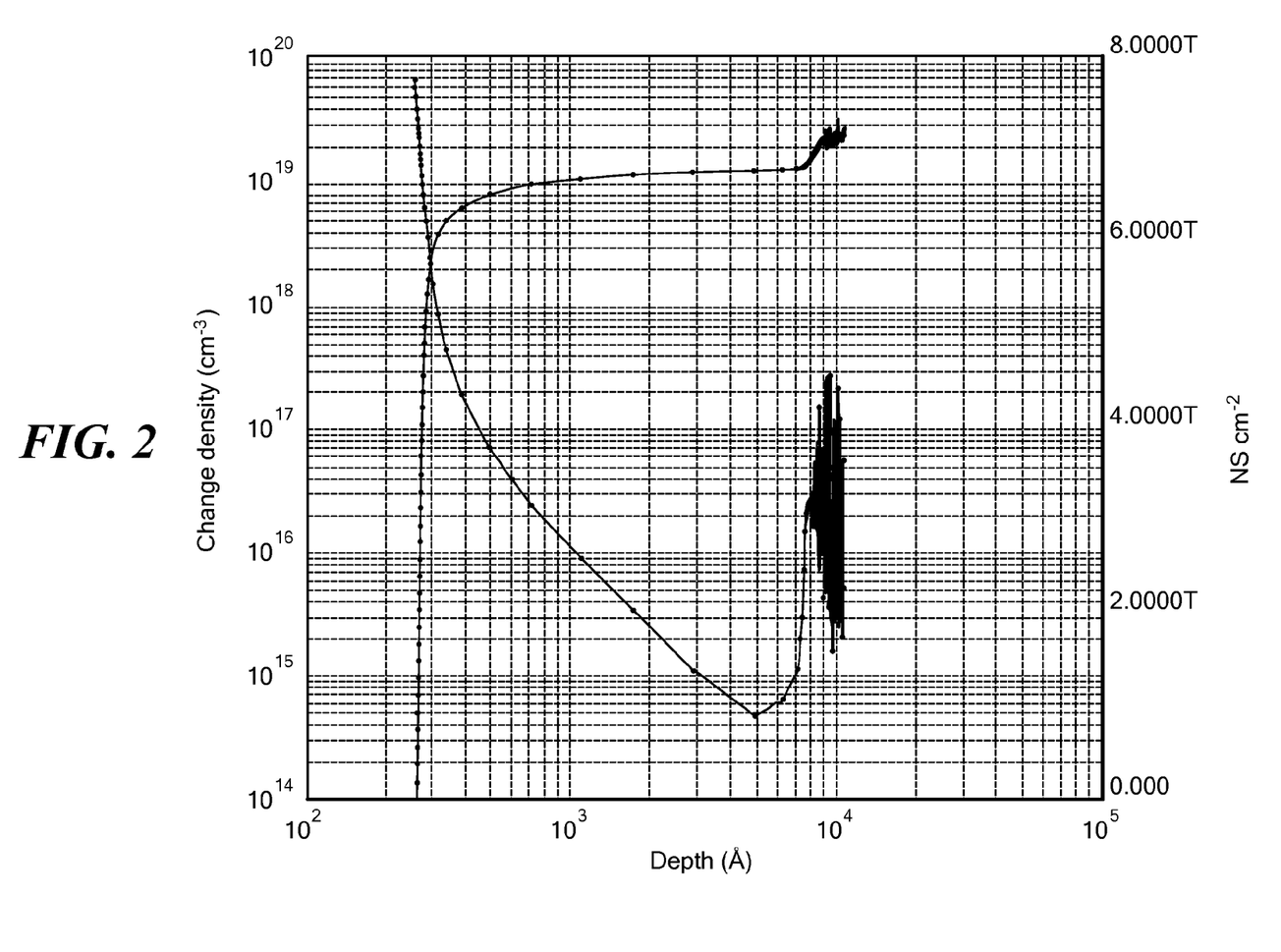
FIG. 2 is a doping-depth plot for the PRIOR ART GaN HEMT of FIG. 1.
Figure 3:
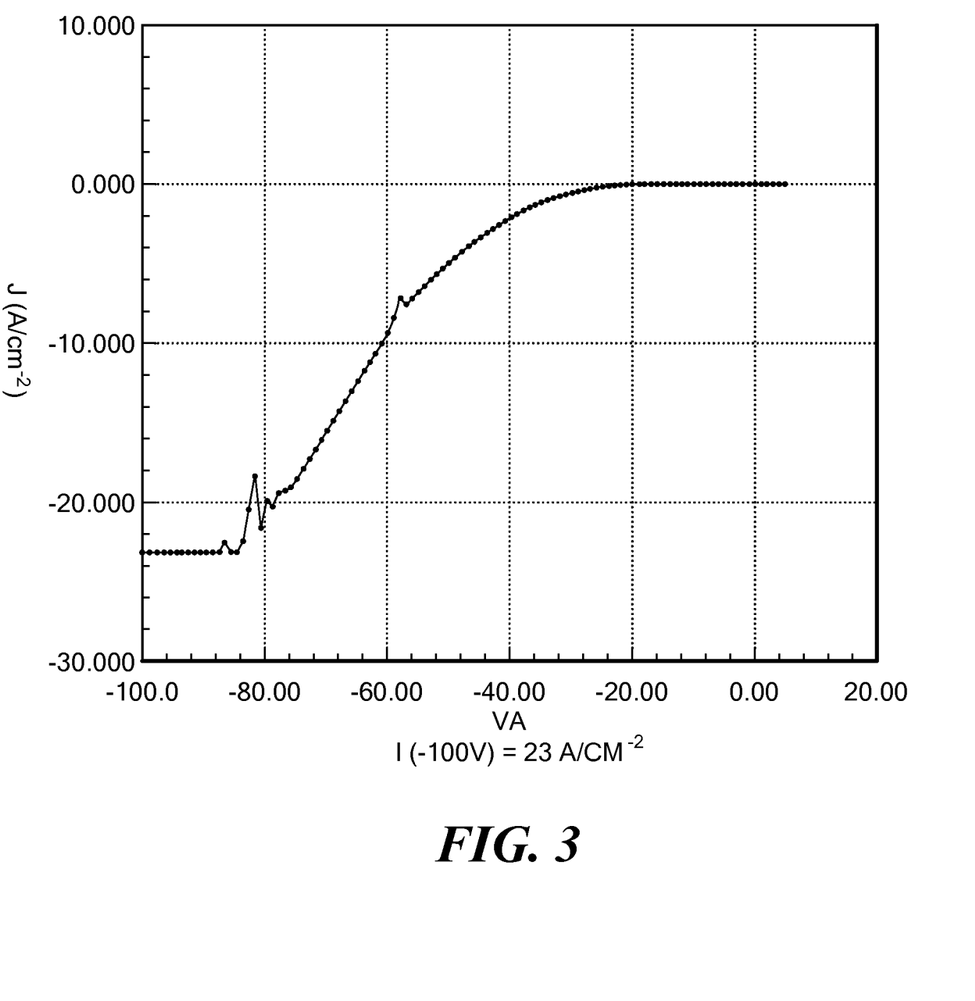
FIG. 3 is a Mercury probe I-V leakage measurement of the PRIOR ART GaN HEMT of FIG. 1.

However, even with an AlN layer we have observed conductivity spikes in HEMT material. FIG. 2 shows a doping-thickness plot of a sample which had an AlN nucleation layer with thickness of 1350 Å. The plot exhibits a conductivity spike deep in the material at a depth of $10^4$ Å or 1 μm. The reverse bias leakage current was also measured on this sample using a mercury probe system. As shown in FIG. 3, the leakage current was significant (20 amperes/cm$^2$) at −80 volts. The AlN in the sample shown in FIG. 1 was grown with an Al/N ratio of approximately 1.57, where the ratio Al/N is the ratio of Al to reactive nitrogen, it being noted that much more nitrogen flux is used compared with the aluminum flux, but only a small portion of the nitrogen flux is reactive. This ratio of Al to reactive nitrogen indicates that there was approximately 57% excess on the growth surface of aluminum to reactive nitrogen. It has been empirically found that Al to reactive nitrogen ratios greater than 1 (aluminum-rich) result in improved films.

Figure 4:
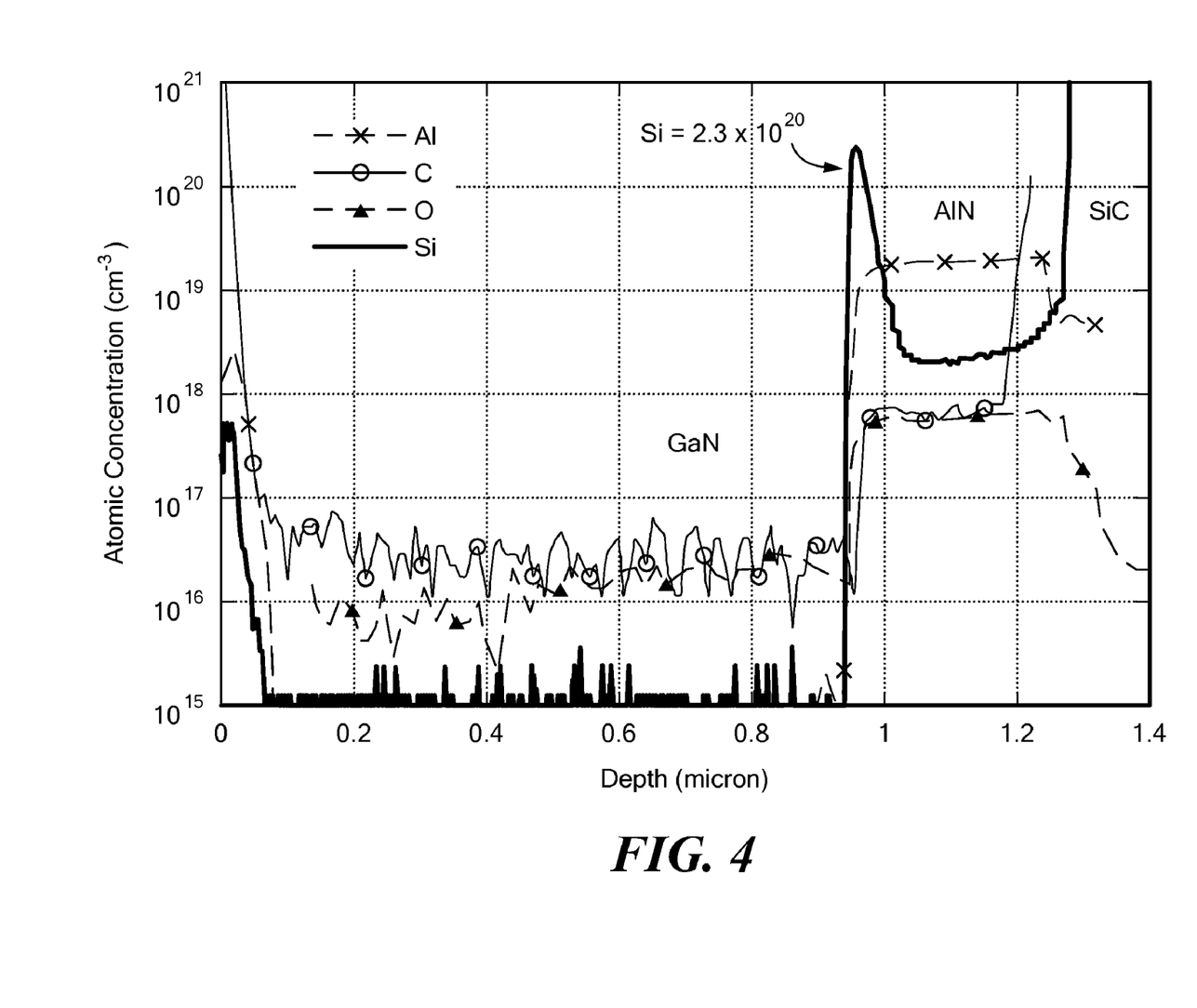
FIG. 4 is a SIMS depth profile of PRIOR ART GaN HEMT of FIG. 1.

FIG. 4 shows the SIMS (secondary ion mass spectroscopy) profile of the sample of FIG. 1. The N-type conduction spike is caused by silicon from the SiC substrate which is migrating through the AlN layer and piling up at the AlN/GaN interface. GaN is easily doped by silicon which results in the conductivity. The sample shown in FIG. 1 contains a 1350 Å AlN layer grown with Al/N=1.57. The profile shows silicon from the SiC substrate migrating through the thick AlN layer and piling up at the GaN/AlN interface.

We believe that the mechanism for such rapid silicon diffusion through the thick AlN layer is due to the excess aluminum on the surface which reacts with the SiC substrate. At our growth temperature of approximately 750° C., aluminum is a liquid.

$$Al(liquid)+SiC \Rightarrow Al_4C_3+Al(liquid+Si) \qquad (1)$$

Since silicon is now in a liquid state, it can rapidly move through the AlN film which is grown with excess aluminum.

Now that we have discovered the source of the doping (silicon) and mechanism for the rapid dopant migration, a structure is provided having a two-step AlN nucleation layer. In the old process the silicon concentration in the AlN peaked at greater than $1 \times 10^{20}$ cm$^{-3}$. In the process according to the invention, the silicon concentration peaked at less than $3 \times 10^{18}$ cm$^{-3}$. Thus, in accordance with the invention the AlN is substantially free of silicon.

In accordance with the invention, it has been demonstrated that good AlN material quality may be obtained with the entire AlN layer being conventionally grown by molecular beam epitaxy (MBE) with an Al to reactive nitrogen ratio greater than 1 (aluminum-rich).

In one embodiment, an initial AlN layer is grown with an Al to reactive nitrogen ratio less than 1 (nitrogen-rich) so that there is no free aluminum to react with the SiC surface. Once the SiC surface has been completely covered by AlN, the Al to reactive nitrogen ratio is increased to greater than 1 (aluminum-rich) for the rest of the layer to improve the material quality. The initial layer can be thin (30–200 Å) since its function is to cover the SiC surface. By making this layer thin, the roughness associated with growing AlN nitrogen-rich is minimized. The second AlN layer grown Al-rich improves the material quality.

In accordance with the invention, a semiconductor structure is provided having a substrate, a first AlN layer having an Al to reactive nitrogen ratio less than 1 disposed on the substrate, and a second AlN layer having an Al to reactive nitrogen ratio greater than 1 disposed on the first AlN layer.

In one embodiment, the substrate is a compound of silicon and wherein the first AlN layer is substantially free of silicon.

In accordance with the invention, a method is provided for forming a semiconductor structure comprises: growing a layer of AlN on a substrate comprising a compound of silicon with the reactive nitrogen flux greater than the aluminum flux; and changing the aluminum and reactive nitrogen fluxes such that the aluminum flux is greater than the reactive nitrogen flux.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 5:
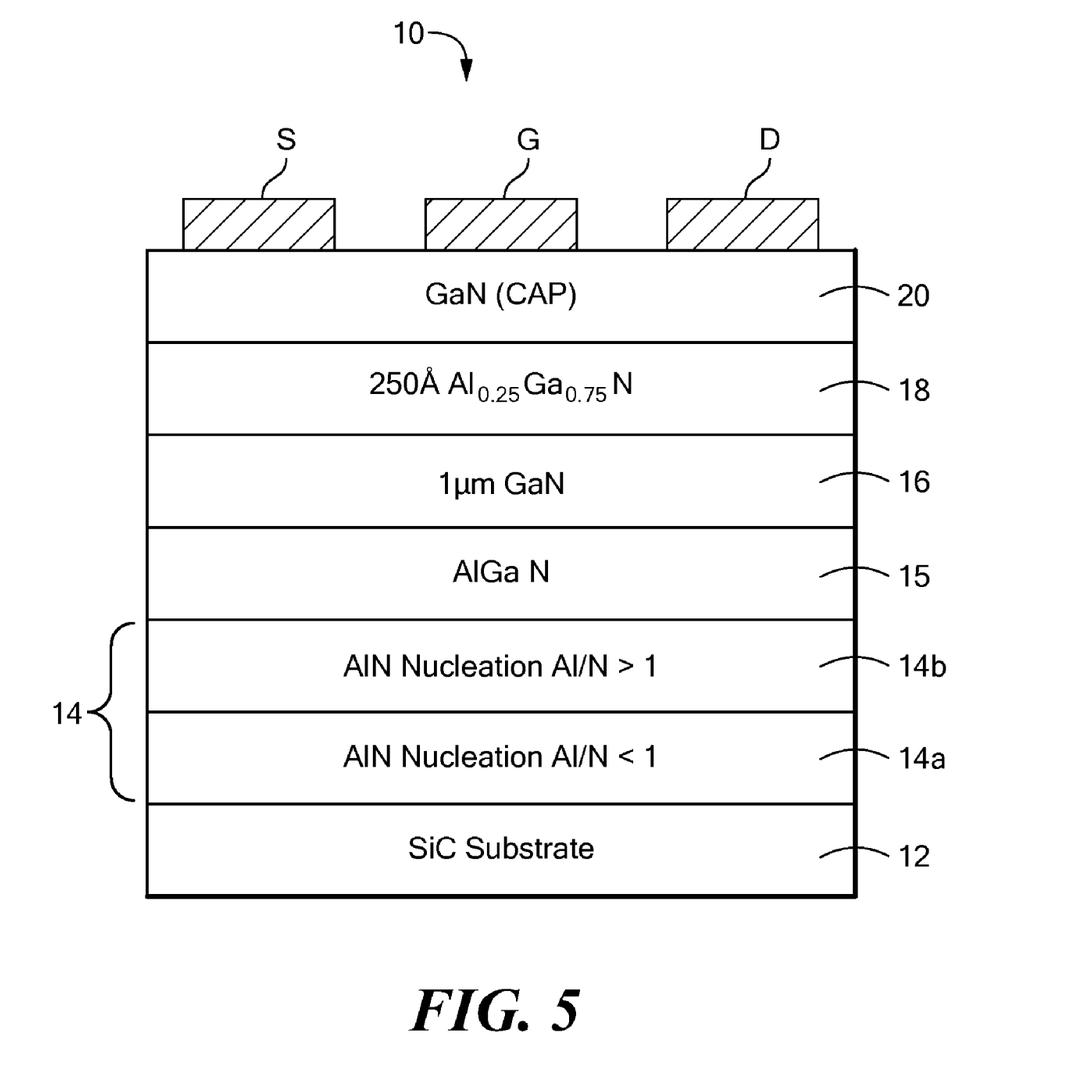
FIG. 5 is a GaN structure according to the invention.
Figure 6:
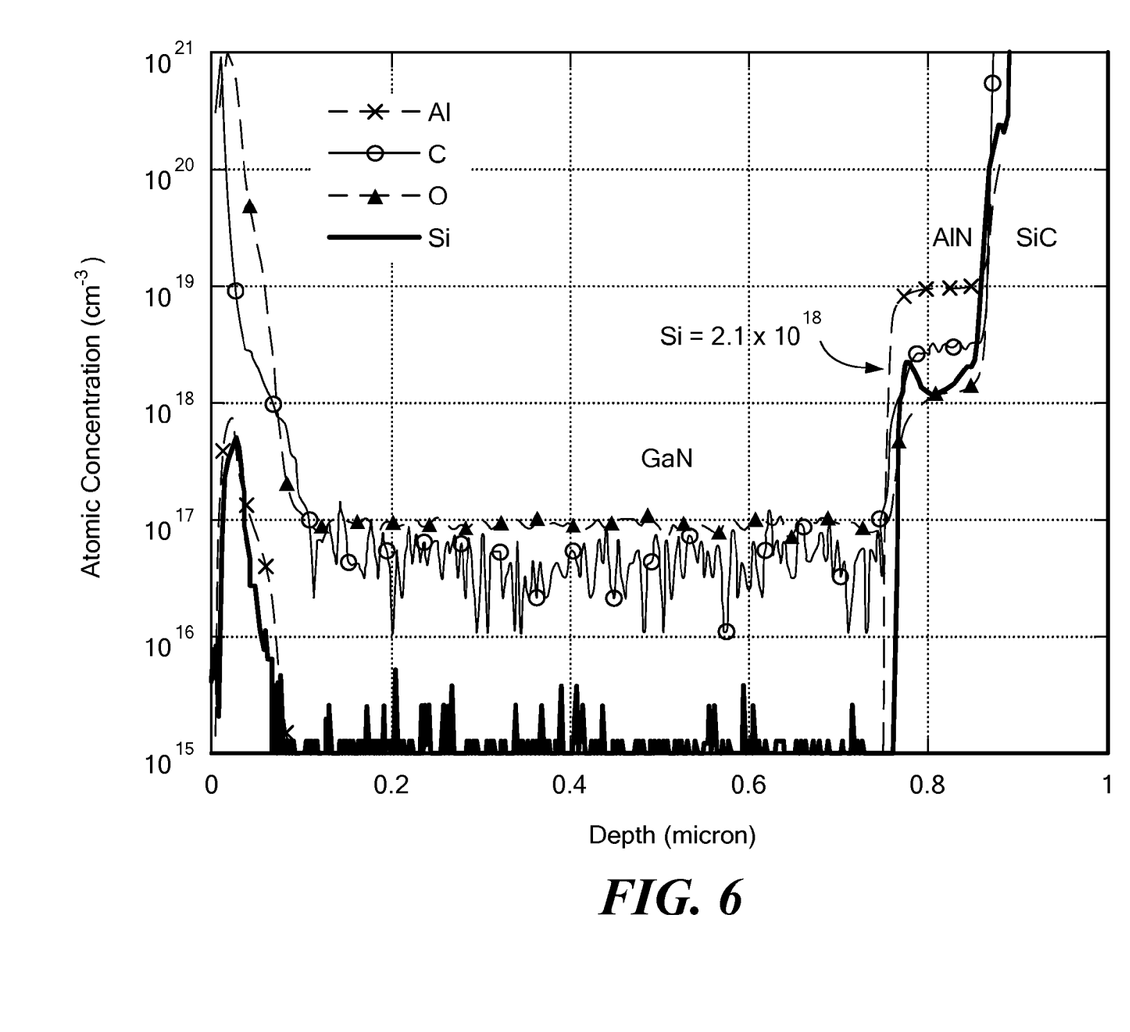
FIG. 6 is a SIMS depth profile of the GaN HEMT structure of FIG. 5.

Referring now to FIG. 5, a GaN HEMT structure 10 is shown to prevent buffer conductivity due to silicon migration from a substrate 12. The substrate 12 is a compound of silicon. Here, the compound is silicon carbide, SiC. The GaN HEMT structure 10 is formed with a two-step AlN layer 14 grown with a significant reduction in silicon migration. The first AlN layer 14a was 115 Å-thick with an Al to reactive nitrogen ratio of 0.97 on the surface of the substrate 12. The second layer 14b was 305 Å-thick with an Al to reactive nitrogen ratio of 1.21 on the first layer 14a giving a total AlN layer 14 thickness of 420 Å. The SIMS profile for the structure 10 is shown in FIG. 6. A comparison with FIG. 4 shows that the maximum silicon (Si) peak at the GaN/AlN interface has been reduced by a factor of 100. Thus, the AlN layer 14 is substantially free of silicon. These improvements were obtained even though the total AlN thickness in FIG. 5 is one-third that in FIG. 1, discussed above.

Completing the structure 10, a GaN layer 16 is grown on the second layer 14b AlN. Optionally, an $Al_xGa_{1-x}N$ layer 15 may be grown under the GaN layer 16.

An $Al_xGa_{1-x}N$ layer 18 is grown on the GaN layer 16. A cap layer 20 of GaN may be grown on the $Al_xGa_{1-x}N$ layer. Source (S) and drain (D) electrodes are formed in ohmic contact with the layer 20 if there is a cap and layer 18 if there is no cap and a gate electrode (G) is formed in Schottky contact with layer 20 if there is a cap and layer 18 if there is no cap in any conventional manner after removal from the MBE machine.

Figure 7A:
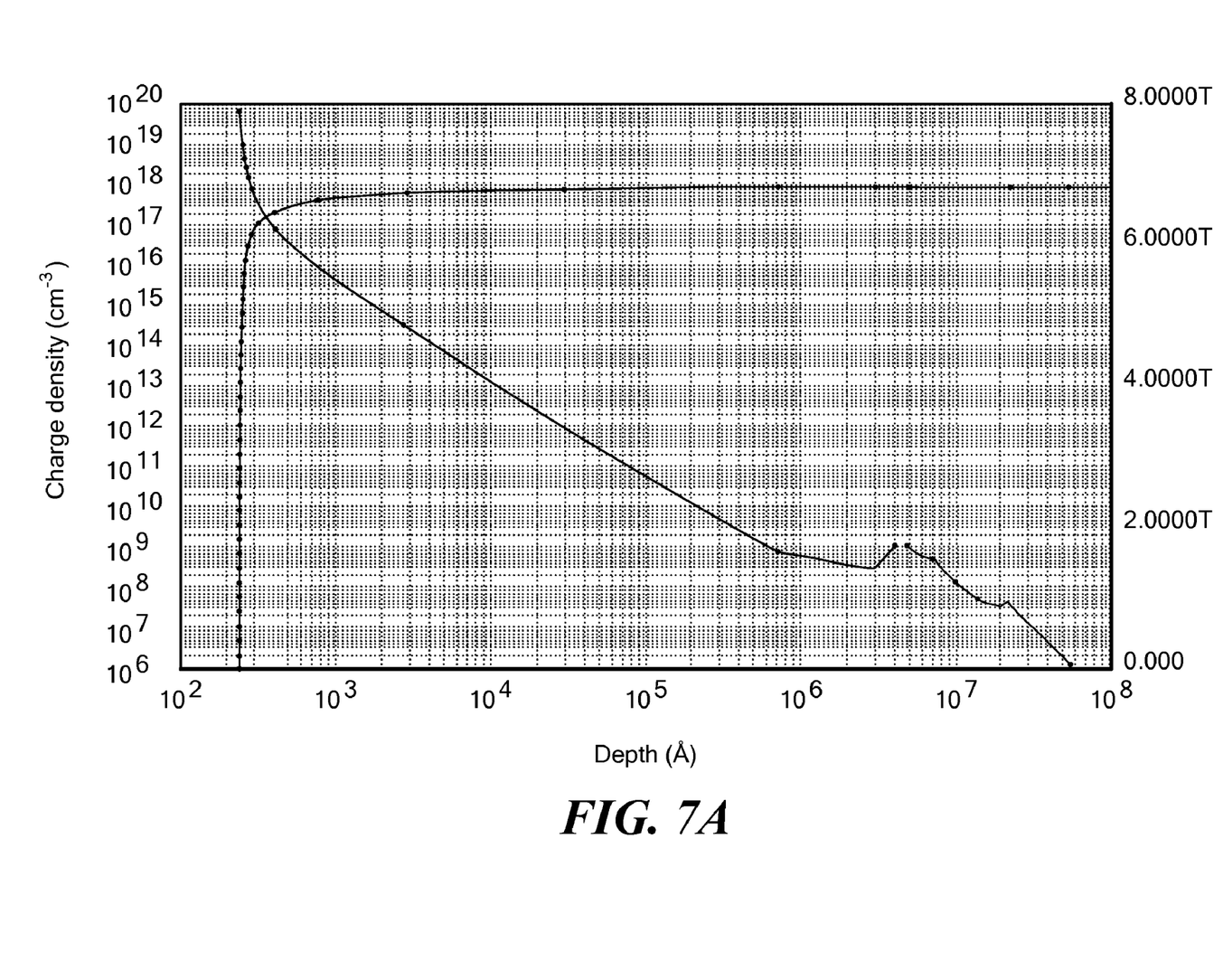
FIG. 7A is a doping-depth plot for the GaN HEMT structure of FIG. 5.
Figure 7B:
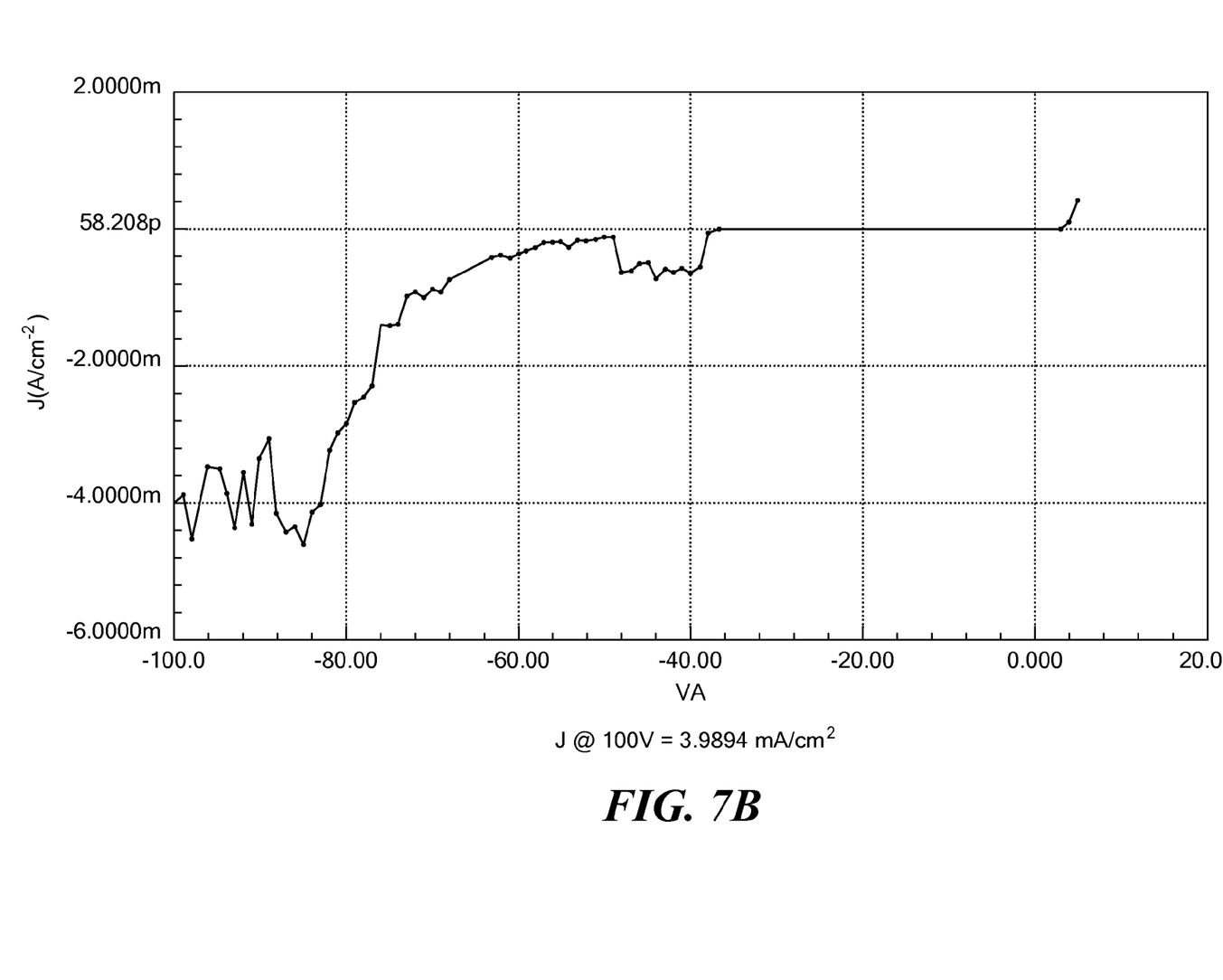
FIG. 7B is a Mercury probe I-V leakage measurement of the GaN HEMT structure of FIG. 5.

Corresponding improvements are observed in the doping-depth profile, FIG. 7A, and Current (I)-voltage (V) i.e., I-V, leakage results shown in FIG. 7B. In comparing FIGS. 2 and 7A, the doping spike has been significantly reduced, if not eliminated. In comparing FIG. 3 and FIG. 7B, it is noted that the leakage current at −80 volts (FIG. 3) has dropped almost 4 orders of magnitude from 20 amperes/$cm^2$ to $2.8×10^{-3}$ amperes/$cm^2$ (FIG. 7B), where FIG. 7A is a doping-depth plot for the GaN HEMT 10 using the two-step AlN buffer layer 14 and FIG. 7B is the mercury probe I-V leakage measurement of the structure of FIG. 5 that shows at −80 volts the leakage current is 2.8 mA/$cm^2$.

It is noted that the nitrogen molecule, $N_2$, is too stable to react with aluminum to form AlN. The process we use is to flow the nitrogen gas through a radio frequency (RF) plasma which excites some of the nitrogen molecules to form reactive nitrogen (a combination of nitrogen atoms and excited nitrogen molecules, $N_2$). The amount of reactive nitrogen that reacts with aluminum is only approximately 1% of the total nitrogen flow. That is why we have to calibrate the machine. Consequently, there is much more nitrogen flux hitting the substrate than aluminum flux. The flux ratio of interest is the Al to reactive nitrogen ratio, not the Al to nitrogen ratio. Nitrogen-rich growth conditions means that the rate of reactive nitrogen atoms (which can react with aluminum) impinging on the substrate surface is higher than the rate of aluminum atoms hitting the substrate surface. The opposite condition is aluminum-rich.

More particularly, we normally change from nitrogen-rich to aluminum-rich by adjusting the rate of aluminum atoms (also called the aluminum flux) impinging on the substrate surface. Aluminum is evaporated and the vapor pressure which determines the aluminum flux increases exponentially with the aluminum furnace temperature. We determine when the Aluminum flux=Reactive nitrogen flux by the following means: First $Al_xGa_{1-x}N$ is grown. (The same nitrogen plasma conditions will be used for AlN as was used for the AlGaN. If the same nitrogen plasma conditions are not used, we estimate the effect of the different conditions on the nitrogen flux.) From x-ray measurements the aluminum concentration is measured. For example, assume it was $Al_{0.25}Ga_{0.75}N$. To grow with Al flux=N reactive flux for AlN then means we need 4 times the aluminum flux so the furnace temperature must be increased to achieve 4 times the vapor pressure. If we use a higher aluminum furnace temperature (and consequently higher vapor pressure) the growth conditions are aluminum-rich.

Figure 8:
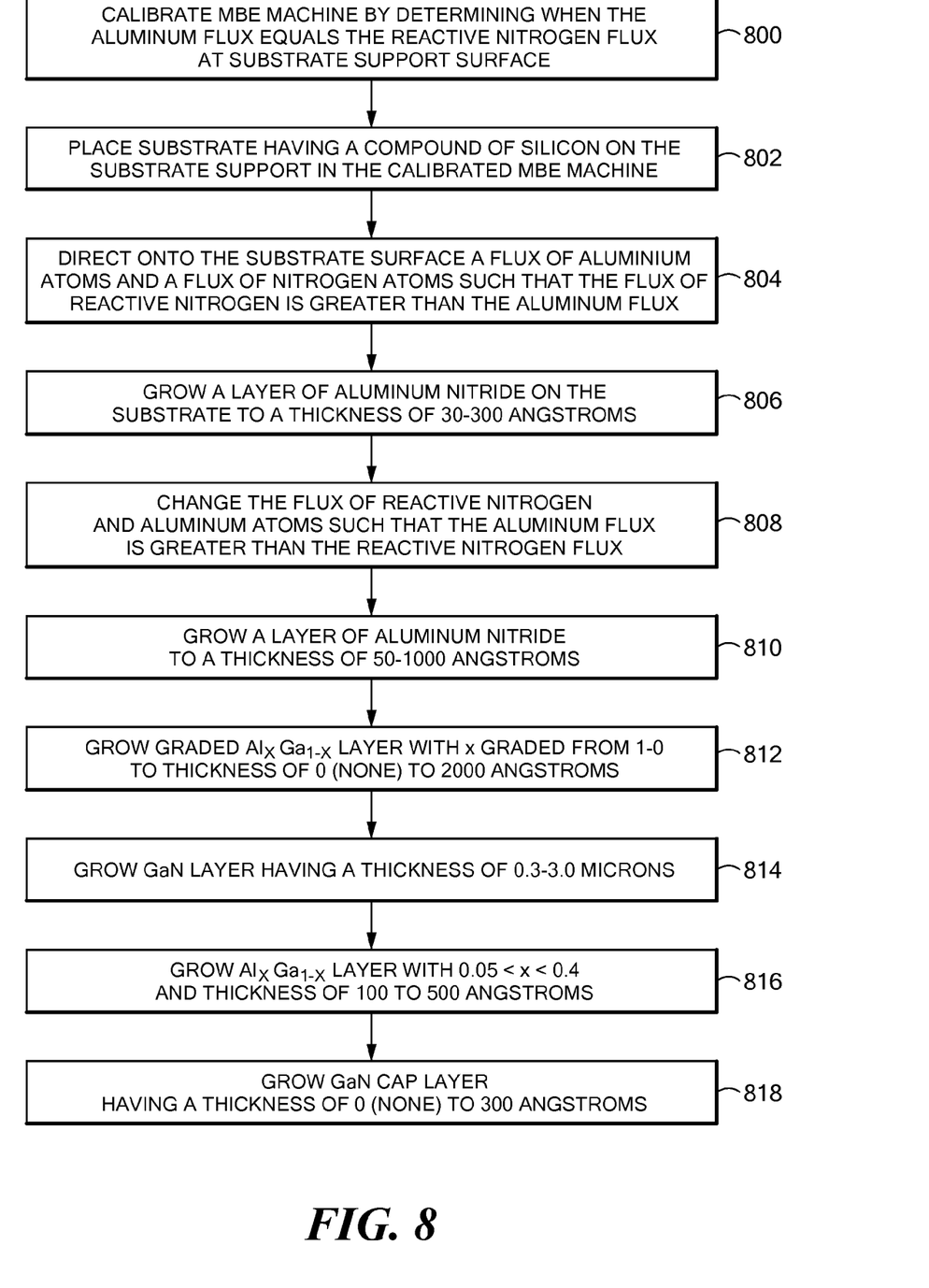
FIG. 8 is a process flow chart of the method used to form the GaN HEMT structure of FIG. 5.

In the process according to the invention, the silicon concentration peaked at less than $3×10^{18}$ $cm^{-3}$. Thus, in accordance with the invention the AlN is substantially free of silicon The process for forming the structure of FIG. 5 is, referring to FIG. 8, as follows:

Calibrate a molecular beam epitaxy (MBE) machine by determining when the Al flux equals the reactive N flux at the substrate surface, Step 800. Place substrate having a compound of silicon into the calibrated MBE machine, Step 802. Direct onto the substrate 12 surface a flux of aluminum atoms and a flux of reactive nitrogen atoms, Step 804. Adjust aluminum and reactive nitrogen fluxes such that the reactive nitrogen flux is greater than the aluminum flux, Step 804. Grow a layer 14a of AlN until a thickness of 30–300 angstroms, Step 806. Change the aluminum and reactive nitrogen fluxes such that the aluminum flux is greater than the reactive nitrogen flux, Step 808. Grow a layer 14b of AlN until a thickness of 50–1000 angstroms, Step 810. Grow a graded $Al_xGa_{1-x}N$ layer 15, with aluminum concentration ramped-down from x=1 to x=0 and having a thickness of 0 angstroms (i.e., no grade) to 2000 angstroms, Step 812. Grow a GaN layer 16 having a thickness of 0.3–3.0 microns, Step 814. Grow $Al_xGa_{1-x}N$ layer 18 with 0.05<x<0.40 and thickness of 100–500 angstroms, Step 816. Grow GaN cap layer 20 with thickness of 0 angstroms (no cap) to 300 angstroms, Step 818.

A number of embodiments of the invention have been described. Nevertheless, it will be understood that various modifications may be made without departing from the spirit and scope of the invention. Accordingly, other embodiments are within the scope of the following claims.

What is claimed is:

1. A method for forming a semiconductor structure comprising:

growing a layer of AlN on a substrate comprising a compound of silicon, such growing comprising directing a flux of aluminum atoms and a flux of reactive nitrogen atoms onto a surface of the substrate with the reactive nitrogen flux greater than the aluminum flux; and changing the aluminum and reactive nitrogen fluxes such that the aluminum flux is greater than the reactive nitrogen flux;

wherein the growing of the layer of AlN on the substrate is with the reactive nitrogen flux greater than the aluminum flux includes growing such layer to a thickness of 30–300 Angstroms;

wherein the growing of said layer of AlN is with the aluminum flux greater than the reaction nitrogen flux growing such layer to a thickness of 50–1000 Angstroms;

including: subsequently growing a graded $Al_xGa_{1-x}N$ layer including subsequently growing an GaN layer; and including subsequently growing an $Al_xGa_{1-x}N$ layer.

2. A method for forming a semiconductor structure comprising:

growing a layer of AlN on a substrate comprising a compound of silicon, such growing comprising directing a non-zero flux of aluminum atoms and a non-zero flux of reactive nitrogen atoms onto the surface of the substrate with the reactive nitrogen flux greater than the aluminum flux; and changing the aluminum and reactive nitrogen fluxes such that the aluminum flux is greater than the reactive nitrogen flux.

3. A method for forming a semiconductor structure comprising:

growing a first layer of AlN on a substrate comprising a compound of silicon, such growing comprising directing a non-zero flux of aluminum atoms and a non-zero flux of reactive nitrogen atoms onto the surface of the substrate with the reactive nitrogen flux greater than the aluminum flux; and growing a second layer of AlN comprising changing the aluminum and reactive nitrogen fluxes of said directed flux of aluminum atoms and a flux of reactive nitrogen atoms such that the aluminum flux is greater than the reactive nitrogen flux.

* * * * *

UNITED STATES PATENT AND TRADEMARK OFFICE
CERTIFICATE OF CORRECTION

| | | |
|---|---|---|
| PATENT NO. | : 7,226,850 B2 | Page 1 of 1 |
| APPLICATION NO. | : 11/132533 | |
| DATED | : June 5, 2007 | |
| INVENTOR(S) | : Hoke et al. | |

It is certified that error appears in the above-identified patent and that said Letters Patent is hereby corrected as shown below:

In the Specification

Col. 1, line 61, delete "process the" and replace with --process, the--.

Col. 1, line 64, delete "invention the" and replace with --invention, the--.

Col. 2, line 24, delete "comprises:" and replace with --comprising--.

Col. 3, line 60, delete "First" and replace with --First,--.

Col. 3, line 64, delete "measurements the" and replace with --measurements, the--.

Col. 4, line 4, delete "pressure) the" and replace with --pressure), the--.

Col. 4, line 7, delete "invention the" and replace with --invention, the--.

Col. 4, line 8, delete "silicon" and replace with --silicon.--.

Col. 4, line 30, delete "with thickness" and replace with --with a thickness--.

In the Claims

Col. 4, line 59, Claim 1, delete "layer" and replace with --layer;--.

Signed and Sealed this
Twenty-fifth Day of February, 2014

Michelle K. Lee
*Deputy Director of the United States Patent and Trademark Office*